United States Patent
Kurniawan et al.

(10) Patent No.: US 6,490,714 B1
(45) Date of Patent: *Dec. 3, 2002

(54) APPARATUS AND METHOD FOR IN-SYSTEM PROGRAMMING OF A FIELD PROGRAMMABLE LOGIC DEVICE USING DEVICE-SPECIFIC CHARACTERIZATION DATA

(75) Inventors: Rusli Kurniawan, Belmont, CA (US); Paul Yeh, Santa Clara, CA (US); Daren Linsenbach, Hillsborough, OR (US)

(73) Assignee: Altera Corporation, San Jose, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/975,835

(22) Filed: Nov. 21, 1997

Related U.S. Application Data

(60) Provisional application No. 60/031,938, filed on Nov. 27, 1996.

(51) Int. Cl.[7] .............................. G06F 17/50
(52) U.S. Cl. .................. 716/17; 365/185.2; 716/2; 716/4; 716/6; 716/16
(58) Field of Search ...................... 375/354; 716/2, 716/4, 6, 16, 17; 365/185.2

(56) References Cited

U.S. PATENT DOCUMENTS

| | | | | |
|---|---|---|---|---|
| 5,333,154 A | * | 7/1994 | Hengeveld | 375/354 |
| 5,414,271 A | * | 5/1995 | Ovshinsky | 257/3 |
| 5,864,503 A | * | 1/1999 | Pascucci | 365/185.2 |
| 5,943,507 A | * | 8/1999 | Cornish | 716/12 |

* cited by examiner

Primary Examiner—Matthew Smith
Assistant Examiner—Thuan Do
(74) Attorney, Agent, or Firm—Pennie & Edmonds LLP

(57) ABSTRACT

A programmable logic device includes field programmable logic circuits and an internal programming circuit. The internal programming circuit includes a memory to store characterization data characterizing programmed voltage values of the field programmable logic circuits as a function of program voltage pulse widths. A characterization data processor programs the field programmable logic circuits using the characterization data.

17 Claims, 5 Drawing Sheets

APPARATUS AND METHOD FOR IN-SYSTEM PROGRAMMING OF A FIELD PROGRAMMABLE LOGIC DEVICE USING DEVICE-SPECIFIC CHARACTERIZATION DATA

This application claims priority to the provisional application entitled "Apparatus and Method for In-System Programming of a Field Programmable Logic Device Using Device-Specific Characterization Data"; Ser. No. 60/031,938, filed Nov. 27, 1996.

BRIEF DESCRIPTION OF THE INVENTION

This invention relates generally to the programming of field programmable logic devices. More particularly, this invention relates to a field programmable logic device that obtains and uses device-specific characterization data during the programming process.

BACKGROUND OF THE INVENTION

Field programmable logic devices are digital logic circuits that can be programmed to perform a variety of logical functions. A specified logical function is programmed into a field programmable logic device by a customer. The customer may subsequently overwrite the initial logical function with a new logical function. These operations are more fully appreciated with reference to FIG. 1.

FIG. 1 illustrates a field programmable logic device 20 which includes a set of field programmable logic circuits 22. A programming pattern 24 specifies a logical function. The programming pattern 24 is programmed into the field programmable logic circuits 22 through an external programming circuit 26. The external programming circuit 26 may be automatic test equipment or some other external device which generates an appropriate set of programming voltages with designated pulse widths and voltage values. An industry-standard 4-pin Joint Test Action Group (JTAG) interface (IEEE Std 1149.1–1990) may be used to install the programming pattern 24.

The advantage of using an external programming circuit 26 is that it typically provides a user with accurate information regarding the parameters associated with the programming of the device. That is, to program field programmable logic circuits 22, selected field programmable logic circuits receive a designated voltage for a predetermined period of time (pulse length). An external programming circuit 26 provides accurate information regarding the precise amount of voltage that is applied to field programmable logic circuits during the programming process. This precise information is used to optimize the programming process.

In the absence of this accurate information; the programming process is typically implemented by using longer voltage pulses. There is a two-fold problem with this approach. First, it is time consuming to apply the longer voltage pulses. Second, the unknown programming voltage and the longer pulses can result in an excess voltage that can place stress on the field programmable logic circuits, thereby diminishing their operative life cycle.

Recently, in-system programmability has been provided in field programmable logic devices. In-system programmability allows field programmable logic circuits 22 to be programmed without an external programming circuit 26. In-system programmability is used when the device is positioned on a circuit board and therefore cannot be programmed with an external programming circuit.

As shown in FIG. 1, the programming pattern 28 is applied to an internal programming circuit 28. The internal programming circuit 28 internally generates voltage signals that are used to program the field programmable logic circuits 22 in accordance with the programming pattern 24.

The problem with an internal programming circuit 4 is that the voltage it generates varies from device to device. That is, different processing tolerances result in devices that generate different voltages. Given this variability from device to device, vendors of field programmable logic devices advise their customers to operate the internal programming circuit with a relatively long voltage pulse to insure that the device is programmed as desired. In other words, the variability from device to device prevents an optimal voltage from being used for the programming of each device. Since an optimal voltage is not used for each device, programming is more time consuming. In addition, the device may generate excessive voltages, which potentially damage the field programmable logic circuits.

In view of the foregoing, it would be highly desirable to provide an improved internal programming circuit for in-system programming of field programmable logic devices.

SUMMARY OF THE INVENTION

A programmable logic device includes field programmable logic circuits and an internal programming circuit. The internal programming circuit includes a memory to store characterization data characterizing programmed voltage values of the field programmable logic circuits as a function of program voltage pulse widths. A characterization data processor programs the field programmable logic circuits using the characterization data.

The characterization data characterizes the physical attributes of the programmable logic device being programmed. This information can be used to select optimal voltage levels and voltage pulse widths for use during the programming process. As a result, the characterization data allows the field programmable logic device to be programmed as quickly as possible. Further, the technique allows the device to be programmed with minimal exposure to excessive voltages.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
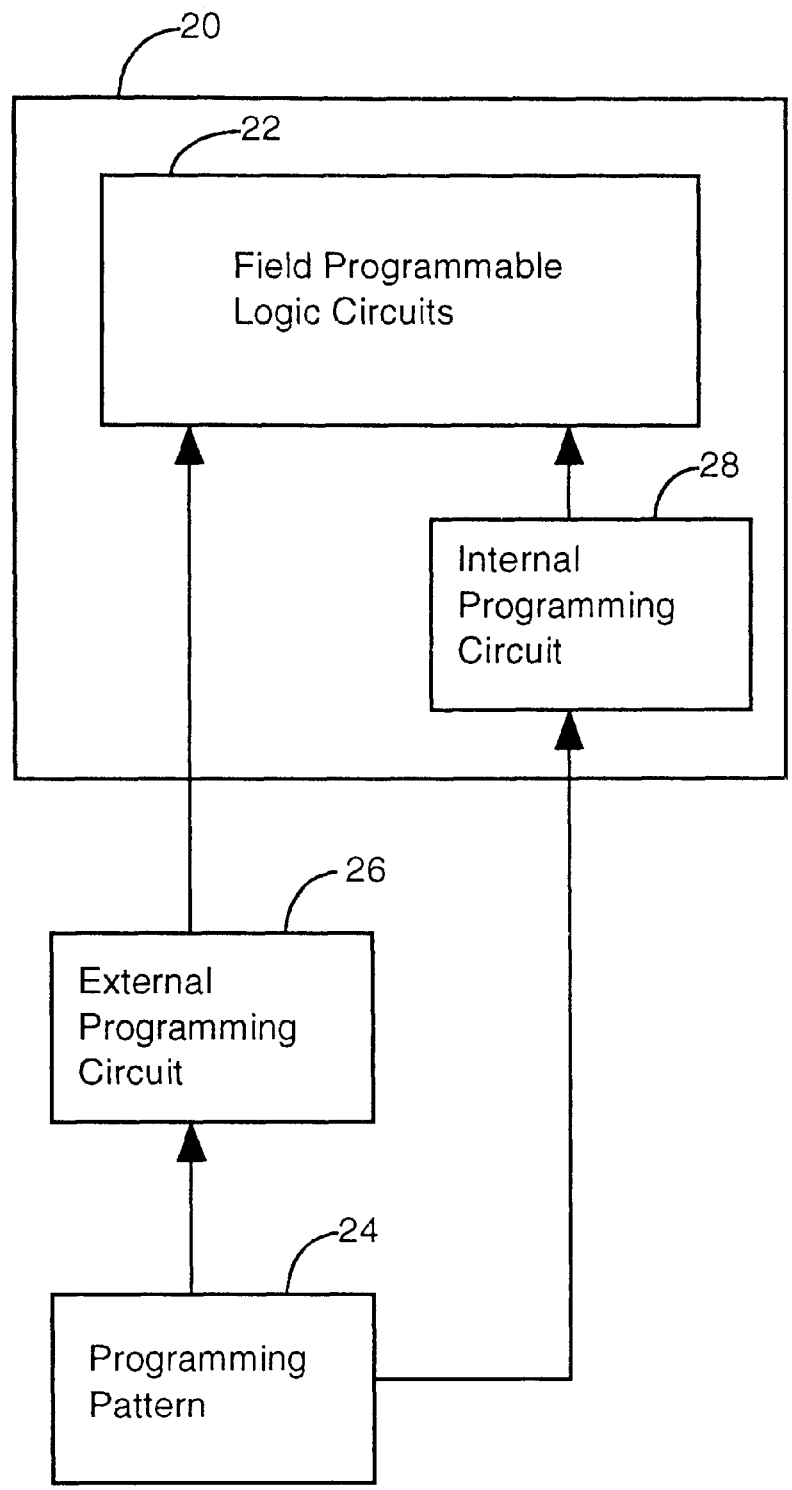
FIG. 1 illustrates a field programmable logic device and external programming circuit in accordance with the prior art.
Figure 2:
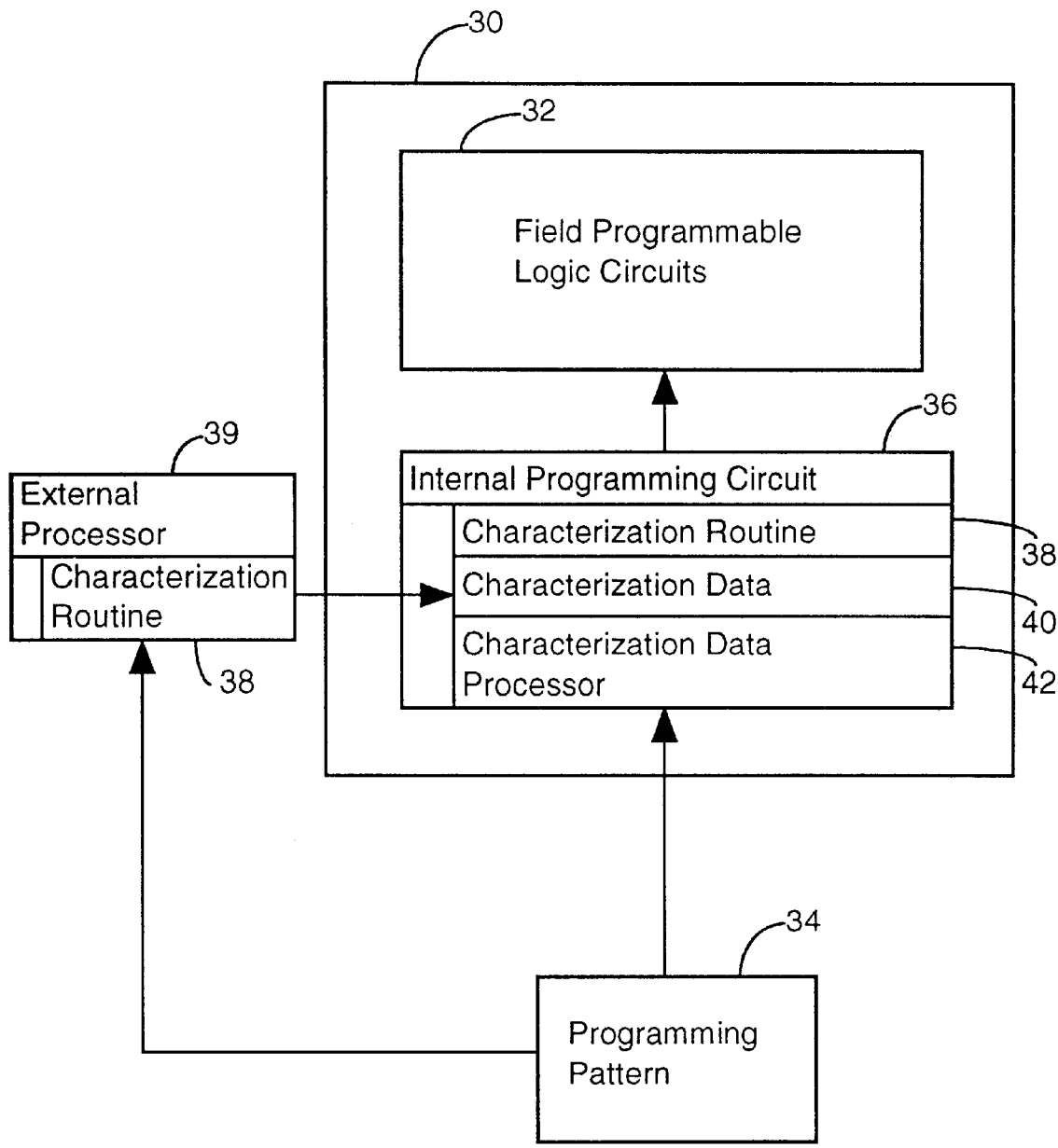
FIG. 2 illustrates a field programmable logic device with an internal programming circuit in accordance with an embodiment of the present invention.

FIG. 2 illustrates a field programmable logic device 30 in accordance with an embodiment of the invention. The device 30 includes standard field programmable logic circuits 32 which are programmed with a programming pattern 34. As in the case of the prior art, the field programmable logic circuits 32 may be programmed with an external programming circuit (not shown). Unlike the prior art, the field programmable logic circuits 32 may also be programmed through the use of a novel internal programming circuit 36, which applies optimal voltage values during the programming process to reduce overall programming time and to reduce stress on the field programmable logic circuits 32.

The internal programming circuit 36 of the invention may be constructed in accordance with known internal programming circuits, but it is further modified to include a characterization routine 38, to store derived characterization data 40, and to process the characterization data with a characterization data processor 42. The characterization routine 38 is a set of executable operations or instructions, generally referred to as a program, which may be implemented as a hardwired circuit, firmware, software, or in any other known equivalent manner. While the characterization routine 38 is shown as being embodied in the field programmable logic device 30, a more commercially attractive embodiment of the invention executes the characterization routine with an external processor 39 and then loads the characterization data into the internal programming circuit 36.

Figure 3:
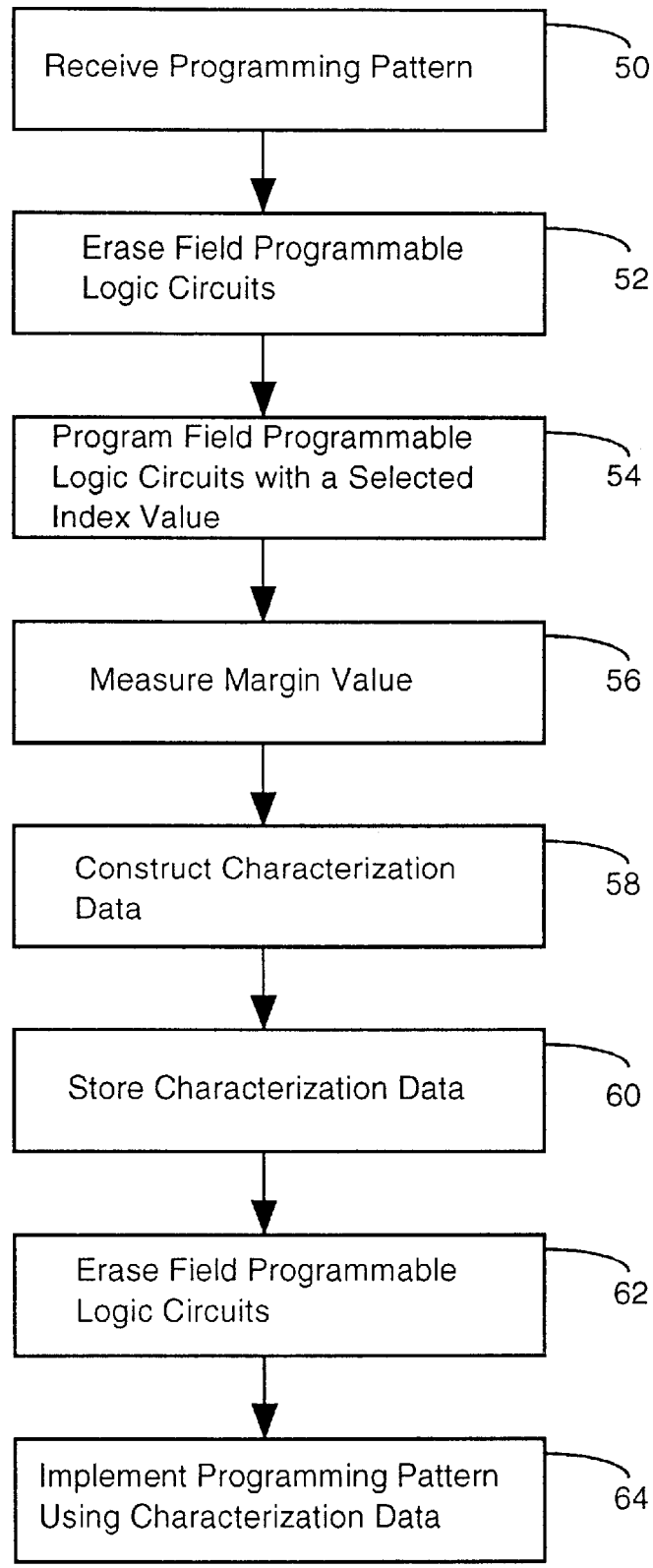
FIG. 3 illustrates processing steps associated with an internal programming circuit constructed in accordance with an embodiment of the invention.

Processing steps associated with either embodiment of the characterization routine 38 are illustrated with steps 50–60 in FIG. 3. FIG. 3 illustrates a first processing step of receiving a programming pattern (step 50). The programming pattern may be received from any external device, as known in the art. In-system programming is typically used when the field programmable logic device 30 is already installed on a circuit board. In such a case, the programming pattern 24 is received from another circuit on the circuit board.

The field programmable logic circuits 32 are then erased (step 52). The next processing step is to program a designated circuit of the field programmable logic circuits with a selected index value (step 54). The index value has an associated pulse length. Table I is an example of a set of index values and pulse lengths which may be used in accordance with an embodiment of the invention.

TABLE 1

| Index Value | Pulse Length (ms) |
|---|---|
| 1 | 1 |
| 2 | 10 |
| 3 | 20 |
| 4 | 30 |
| 5 | 40 |

The pulse length shown in Table I is the amount of time that a programming voltage signal is applied to the designated circuit. The index value has a corresponding voltage value, which is unknown. However, it can be observed that to program a device, a low index value, such as 1, will have a relatively high voltage because the pulse length is short, whereas, a high index value, such as 5, will have a relatively low voltage because the pulse length is long. In other words, to program the device, either a relatively high voltage pulse width is used for a relatively short period of time, or a relatively low voltage pulse width is used for a relatively long period of time.

As indicated above, the index value is associated with a corresponding voltage value, which is unknown. A problem discussed above is that prior art internal programming circuits 28 have applied voltages that vary from device to device. Thus, the applied voltage for any given device is unknown. The pulse length, on the other hand, can be accurately measured. Thus, by way of example, an index value of 1 has a known pulse length of 1 millisecond. As indicated above, the voltage value is unknown, but it is known to be relatively large.

After programming a designated circuit with a selected index value, a margin value is measured (step 56). The measurement of a margin value is the measurement of the stored charge on a floating gate of the designated circuit after the programming step (step 54). It is known in the art how to use an internal programming circuit or an external processor to measure a margin value on a circuit.

The next processing step associated with the invention is to construct characterization data (step 58). The characterization data plots voltage values as a function of pulse length. The pulse lengths associated with different index values are known. The measured voltage is plotted with respect to the pulse length for the given index value.

Figure 4:
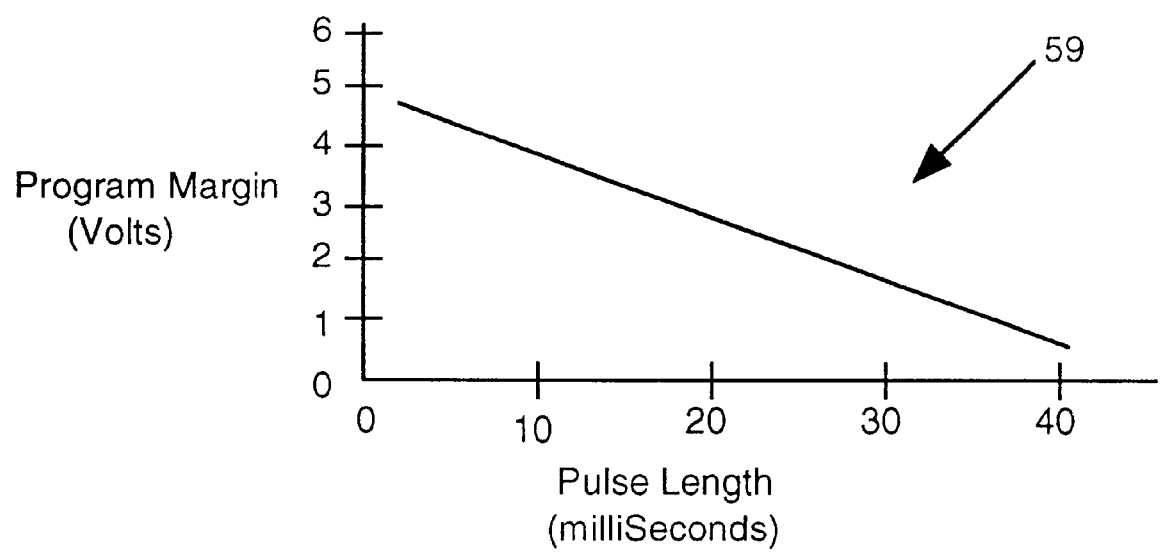
FIG. 4 illustrates derived margin/pulse length data in accordance with an embodiment of the invention.

FIG. 4 illustrates a plot 59 as a function of pulse length and program margin. The plot 59 begins at a pulse length of 1 millisecond (corresponding to an index of 1) and at a measured voltage of slightly less than 5 volts. The slope of the plot 59 is known from previous empirical measurements of similar devices. In other words, a slope value is previously stored with the characterization routine 38. Thus, a complete line can be drawn for all of the pulse lengths associated with the index values of Table I, as shown in FIG. 4. The plot 59 illustrates that a pulse length of 10 milliseconds (corresponding to an index value of 2) has a voltage value of approximately 4 volts, etc.

In sum, the characterization routine 38 initially stores a slope value and then uses the slope value along with the measured program margin to create characterization data of the type shown in FIG. 4. The characterization data establishes a program margin for each pulse length, which can be associated with each index value. The derived characterization data is unique for each device, because it is based upon the unique measured voltage for each device.

The next processing step illustrated in FIG. 3 is to store the characterization data (step 60). FIG. 2 illustrates characterization data 40 being stored with the internal programming circuit 36. That is, the internal programing circuit 36 includes a memory to store the characterization data 40.

Once the characterization data is available, it may be processed with a characterization data processor 42. The characterization data processor 42 may be used to erase the field programmable logic circuits (step 62). This step erases the margin value programmed into the designated circuit during step 54.

The final processing step shown in FIG. 3 is to implement a programming pattern using the characterization data (step 64). This operation can also be performed immediately after step 58.

Step 64 entails programming the programming pattern 34 into the field programmable logic circuits 32 using the characterization data 40. In other words, instead of relying upon generalized default voltage values and pulse lengths for programming a device, the characterization data processor 42 uses device-specific characterization data to program a device. That is, the characterization data has an associated plot 59 which particularly characterizes the programming requirements for a particular device. For example, it may be known that 3 volts are required to turn-on a particular gate.

FIG. 4 illustrates that pulse lengths between 1 and 20 milliseconds and corresponding voltages between 3 and 5 volts may be used to obtain this margin. The particular voltage value and pulse length used to program the device depends upon how safely one intends to be above the threshold value. To be safe, the prior art relies upon relatively high voltage values (say 5 volts) or relatively long pulse lengths (say 15 milliseconds) to insure a safe margin over a threshold. With the present invention, inaccurate, but safe, default values of this type do not need to be used. Instead, an accurate and safe programming value can be used based upon the device-specific characterization data. As a result, the programming operation can be optimized to reduce the amount of time required to program a device. In addition, the programming operation can be tailored to avoid damage from generating excess charge on a device.

Note that the characterization data 40 is stored in the field programmable logic device 30. Thus, if the device 30 is to be re-programmed, only step 64 of FIG. 3 needs to be executed.

Figure 5:
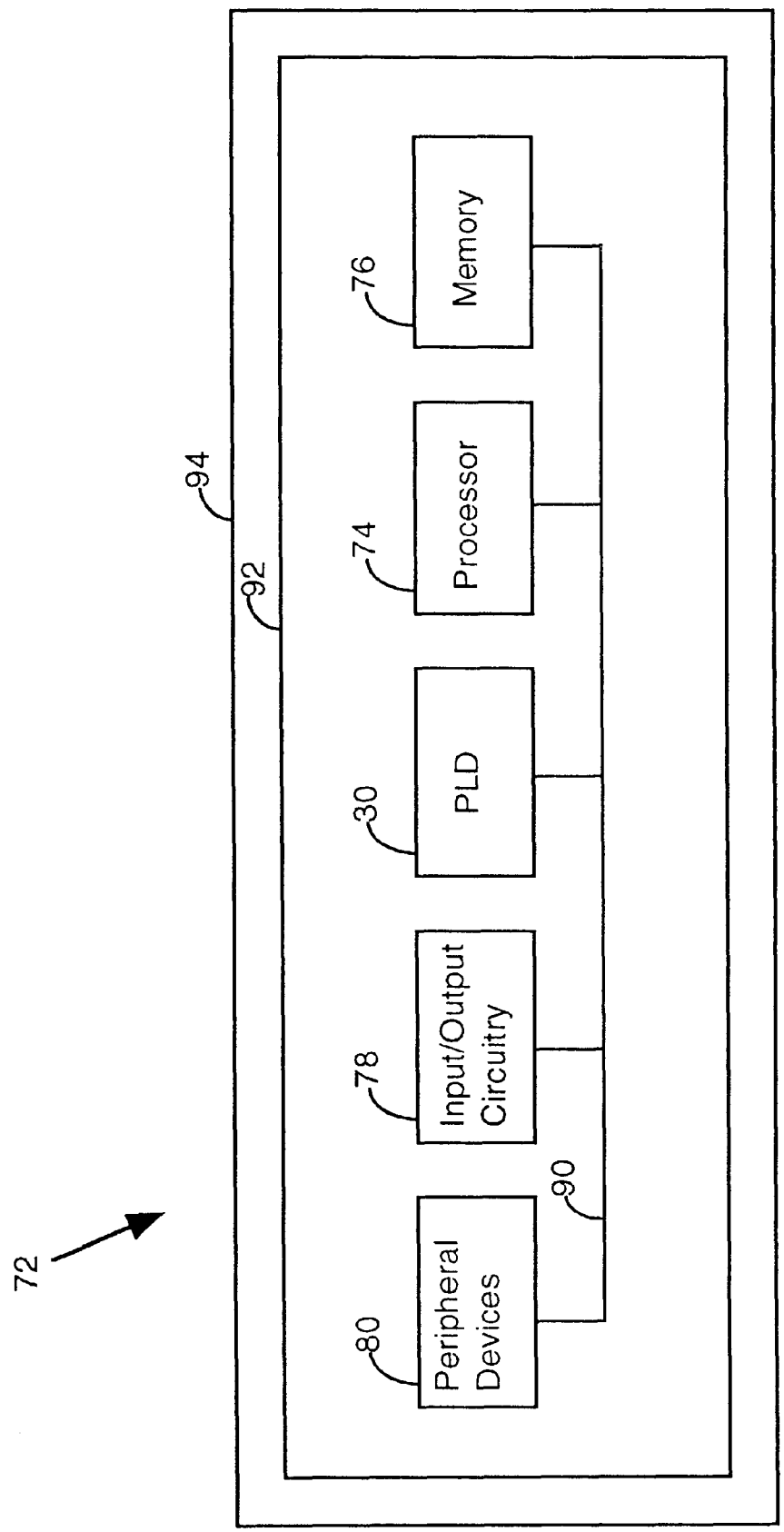
FIG. 5 illustrates a programmable logic device of the invention incorporated into a data processing system.

FIG. 5 illustrates a programmable logic device (PLD) 30 of the invention forming a part of a data processing system 72. The data processing system 72 may include one or more of the following components: a processor 74, a memory 76, input/output circuitry 78, and peripheral devices 80. These components are coupled together by a system bus 90 and are populated on a circuit board 92, which is contained in an end-user system 94.

The system 72 can be used in a wide variety of applications, such as computer networking, data networking, instrumentation, video processing, digital signal processing, or any other application where the advantage of using re-programmable logic is desirable. The PLD 70 can be used to perform a variety of logic functions. For example, the PLD 70 can be configured as a processor or controller that works in cooperation with processor 74. The PLD 70 may also be used as an arbiter for arbitrating access to a shared resource in the system 72. In yet another example, the PLD 70 can be configured as an interface between the processor 74 and one of the other components in the system 72.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following Claims and their equivalents.

What is claimed is:

1. A programmable logic device, comprising:
   field programmable logic circuits; and
   an internal programming circuit including
      a memory to store characterization data characterizing programmed voltage values of said field programmable logic circuits as a function of a plurality of program voltage pulse widths, wherein said characterization data is generated based on a measured voltage margin value and a pre-determined slope value that represents a relationship between program voltage pulse widths and program voltage values typical in devices similar to the programmable logic device, and wherein said measured voltage margin value is representative of a measured amount of stored charge of a floating gate of a designated one of the field programmable logic circuits after the designated field programmable logic circuit is programmed at least in part according to one of the plurality of program voltage pulse widths, and
      a characterization data processor to program said field programmable logic circuits using said characterization data.

2. The apparatus of claim 1 wherein said characterization data includes index values corresponding to said voltage pulse widths.

3. The apparatus of claim 1 wherein said characterization data processor processes a programming pattern containing information for programming said field programmable logic circuits.

4. The apparatus of claim 3 wherein said characterization data processor processes said programming pattern by selecting programming voltage values and programming voltage pulse widths based upon said characterization data.

5. A data processing system, comprising:
   a field programmable logic device, including
      field programmable logic circuits; and
      an internal programming circuit including
         a memory to store characterization data characterizing programmed voltage values of said field programmable logic circuits as a function of a plurality of program voltage pulse widths, wherein said characterization data is generated based on a measured voltage margin value and a pre-determined slope value that represents a relationship between program voltage pulse widths and program voltage values typical in devices similar to the programmable logic device, wherein said measured voltage margin value is representative of a measured amount of stored charge of a floating gate of a designated one of the field programmable logic circuits after the designated field programmable logic circuit is programmed at least in part according to one of the plurality of program voltage pulse widths, and
         a characterization data processor to program said field programmable logic circuits using said characterization data.

6. The apparatus of claim 5 further comprising:
   a system bus connected to said field programmable logic device; and
   a plurality of data processing elements connected to said system bus.

7. The apparatus of claim 6 wherein said plurality of data processing elements include a processor and input/output circuitry.

8. The apparatus of claim 6 wherein said plurality of data processing elements include peripheral devices and a memory.

9. A method of programming a programmable logic device, said method comprising the steps of:
   receiving a programming pattern specifying a functional operation to be performed by a programmable logic device;

applying a voltage pulse with a known pulse width to a designated circuit of said programmable logic device;

measuring a voltage margin value for said designated circuit, said voltage margin value representative of a measured amount of stored charge of a floating gate of the designated circuit;

combining said voltage margin value with a known slope value to construct characterization data characterizing programmed voltage values of said programmable logic device as a function of program voltage pulse widths, wherein said known slope value represents a relationship between program voltage pulse widths and program voltage values typical in devices similar to the programmable logic device;

storing said characterization data within said programmable logic device; and programming said programmable logic device with said programming pattern by selecting programming voltage values and programming voltage pulse widths based upon said characterization data.

10. The method of claim 9 further comprising the step of erasing said programmable logic device before said applying step.

11. The method of claim 9 further comprising the step of erasing said programmable logic device before said programming step.

12. A programmable logic device configured to be coupled on a circuit board, comprising:

field programmable logic circuits; and an internal programming circuit configured to program a programming pattern into the field programmable logic circuits, the internal programming circuit comprising a memory configured to store device-specific characterization data, wherein the device-specific characterization data is representative of a plurality of voltage pulse widths and a plurality of voltage margin values, wherein at least one of said voltage margin values is representative of an amount of stored charge on a floating gate of a designated one of the field programmable logic circuits; and a characterization data processor configured to use the device-specific characterization data to program the programming pattern into the field programmable logic circuits.

13. The programmable logic device of claim 12 wherein the internal programming circuit comprises a characterization routine configured to program a designated one of the field programmable circuits with a specified voltage pulse width, to measure a voltage margin value of the designated circuit after programming the designated circuit and to generate the characterization data according to the measured voltage margin value and the specified voltage pulse width.

14. The programmable logic device of claim 13 wherein the characterization routine generates the characterization data according to the measured voltage margin value, the specified voltage pulse width and a pre-determined slope value representative of a relationship between voltage pulse widths and voltage margin values typical in devices similar to the programmable logic device.

15. The programmable logic device of claim 12 wherein the internal programming circuit is configured to use a selected one of the voltage pulse widths and a corresponding one of the voltage margin values to program the programming pattern into the field programmable logic circuits.

16. A method of programming a specified programming pattern into a programmable logic device that is configured to couple on a circuit board, the method comprising:

obtaining device-specific characterization data representative of a plurality of program voltage pulse widths and a plurality of corresponding program voltage values, wherein the plurality of corresponding program voltage values are specific to the programmable logic device, the obtaining further comprising applying a program voltage pulse with a known pulse width to a designated field programmable logic circuit of the programmable logic device and measuring a voltage margin value for the designated field programmable logic circuit, wherein the voltage margin value is representative of an amount of stored charge on a floating gate of the designated circuit;

selecting one of the plurality of program voltage pulse widths and a corresponding one of the program voltage values; and programming the specified programming pattern into the programmable logic device with the selected program voltage pulse width and the corresponding program voltage value.

17. The method of claim 16 wherein the obtaining step includes combining the voltage margin value with a pre-determined slope value to construct the characterization data, wherein the pre-determined slope value is representative of a relationship between program voltage pulse widths and program voltage values typical in devices similar to the programmable logic device.

* * * * *